US012668603B2

(12) United States Patent
Ermert et al.

(10) Patent No.: US 12,668,603 B2
(45) Date of Patent: Jun. 30, 2026

(54) FUNCTIONALIZED ORGANOTIN PRECURSORS AND RELATED METHODS

(71) Applicant: ENTEGRIS, INC., Billerica, MA (US)

(72) Inventors: David M. Ermert, Danbury, CT (US); Thomas M. Cameron, Newtown, CT (US); Claudia Fafard, New Milford, CT (US)

(73) Assignee: Entegris, Inc., Billerica, MA (US)

( * ) Notice: Subject to any disclaimer, the term of this patent is extended or adjusted under 35 U.S.C. 154(b) by 41 days.

(21) Appl. No.: 18/389,209

(22) Filed: Nov. 13, 2023

(65) Prior Publication Data

US 2024/0174699 A1 May 30, 2024

Related U.S. Application Data

(60) Provisional application No. 63/425,354, filed on Nov. 15, 2022.

(51) Int. Cl.

| | |
|---|---|
| ***C07F 7/22*** | (2006.01) |
| ***C23C 16/40*** | (2006.01) |
| ***C23C 16/455*** | (2006.01) |

(52) U.S. Cl.

CPC .......... *C07F 7/2284* (2013.01); *C23C 16/407* (2013.01); *C23C 16/45553* (2013.01)

(58) Field of Classification Search

None

See application file for complete search history.

(56) References Cited

U.S. PATENT DOCUMENTS

| | | | | |
|---|---|---|---|---|
| 2019/0137870 | A1 | 5/2019 | Meyers et al. | |
| 2019/0315781 | A1* | 10/2019 | Edson | C07F 7/2224 |
| 2020/0223877 | A1 | 7/2020 | Odedra et al. | |
| 2021/0013034 | A1 | 1/2021 | Wu et al. | |
| 2022/0005687 | A1 | 1/2022 | Liu et al. | |
| 2023/0266664 | A1* | 8/2023 | Hansen | G03F 7/0042 430/325 |

FOREIGN PATENT DOCUMENTS

| | | | | |
|---|---|---|---|---|
| WO | WO-2017066319 | A2 * | 4/2017 | G03F 7/162 |
| WO | 2019199467 | A1 | 10/2019 | |
| WO | WO-2022006501 | A1 * | 1/2022 | C07F 7/2284 |

* cited by examiner

*Primary Examiner* — Michael P. Rodriguez

(57) ABSTRACT

Precursors useful in the formation of tin-containing films are provided. The precursors comprise a functionalized tin compound in which one or more ligands are coordinated to Sn, and the Sn is functionalized with at least one functional group. Methods for forming the precursors and methods for forming tin-containing films using the precursors are further provided.

4 Claims, 2 Drawing Sheets

FUNCTIONALIZED ORGANOTIN PRECURSORS AND RELATED METHODS

PRIORITY CLAIM

This application claims the benefit of U.S. provisional patent application No. 63/425,354 with a filing date of Nov. 15, 2022, which provisional patent application is incorporated by reference herein.

FIELD

The present disclosure relates to functionalized organotin precursors and related methods.

BACKGROUND

Some precursors are useful in the manufacture of microelectronic devices. The manufacture of such devices can involve use of extreme ultraviolet (EUV) lithography to form thin films.

SUMMARY

Some embodiments relate to a composition. In some embodiments, the composition comprises a precursor of the formula:

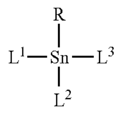

where:

R is an alkyl, an alkenyl, an alkynyl, a cycloalkyl, an aryl, a silyl, a silylalkyl, an aminoalkyl, an alkoxyalkyl, or an aralkyl;

$L^1$, $L^2$, and $L^3$ are each independently an amide, an alkoxide, an acetylide, a carbamate, or a carboxylate.

In some embodiments, the precursor has a purity of at least 99%.

In some embodiments, R is $—CH_3$ or $—CH(CH_3)_2$.

In some embodiments, R is $—C_6H_5$.

In some embodiments, R is $—CH_2(C_6H_5)$.

In some embodiments, R is $—CH_2N(CH_3)_2$ or $—(CH_2)_3N(CH_3)_2$.

In some embodiments, R is $—CH_2CH_2OCH_3$.

In some embodiments, R is $—CH_2Si(CH_3)_3$.

In some embodiments, R is $—Si(CH_3)_3$.

In some embodiments, $L^1$, $L^2$ and $L^3$ are each independently at least one of the following:

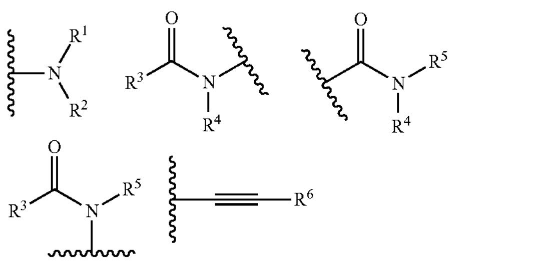

-continued

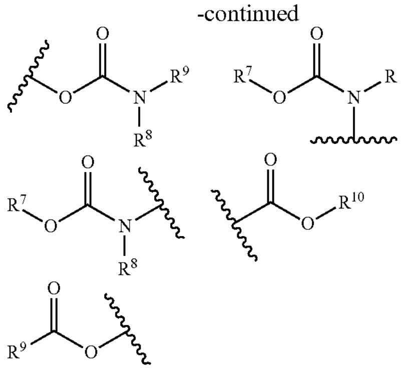

where:

$R^1$, $R^2$, $R^3$, $R^4$, $R^5$, $R^6$, $R^7$, $R^8$, $R^9$, and $R^{19}$ are each independently an alkyl, an alkenyl, an alkynyl, a cycloalkyl, an aryl, a silyl, a silylalkyl, an aminoalkyl, an alkoxyalkyl, or an aralkyl.

In some embodiments, $L^1$, $L^2$, or $L^3$ are $—N(CH_3)_2$.

In some embodiments, the precursor has the chemical structure:

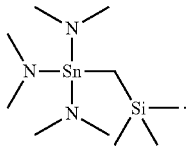

In some embodiments, the precursor has the chemical structure:

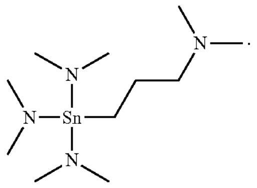

Some embodiments relate to a method. In some embodiments, the method comprises obtaining a tin compound. In some embodiments, the method comprises obtaining a halide compound. In some embodiments, the method comprises contacting the tin compound and the halide compound so as to form a precursor of the formula:

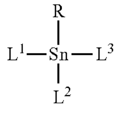

where:

R is an alkyl, an alkenyl, an alkynyl, a cycloalkyl, an aryl, a silyl, a silylalkyl, an aminoalkyl, an alkoxyalkyl, or an aralkyl;

$L^1$, $L^2$, and $L^3$ are each independently an amide, an alkoxide, an acetylide, a carbamate, or a carboxylate.

In some embodiments, the tin compound comprises at least one compound of the formula: $SnL_2$, wherein each L is independently $L^1$, $L^2$, or $L^3$; wherein $L^1$, $L^2$, or $L^3$ are each independently an amide, an alkoxide, an acetylide, a carbamate, or a carboxylate.

In some embodiments, $L^1$, $L^2$, and $L^3$ are each independently at least one of the following:

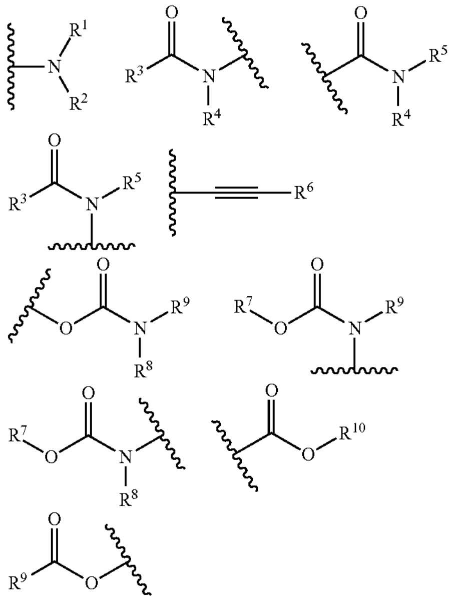

where:

$R^1$, $R^2$, $R^3$, $R^4$, $R^5$, $R^6$, $R^7$, $R^8$, $R^9$, and $R^{19}$ are each independently an alkyl, an alkenyl, an alkynyl, a cycloalkyl, an aryl, a silyl, a silylalkyl, an aminoalkyl, an alkoxyalkyl, or an aralkyl.

In some embodiments, the halide compound is a compound of the formula:

X—R where:

R is an alkyl, an alkenyl, an alkynyl, a cycloalkyl, an aryl, a silyl, a silylalkyl, an aminoalkyl, an alkoxyalkyl, or an aralkyl;

X is Cl, Br, F, or I.

In some embodiments, the tin compound and the halide compound are contacted in a solvent.

In some embodiments, the solvent comprises hexane.

In some embodiments, the contacting is performed under heating at temperature in a range of 30° C. to 150° C.

Some embodiments relate to a method. In some embodiments, the method comprises obtaining a precursor; wherein the precursor has the formula:

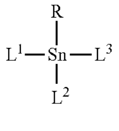

where:

R is an alkyl, an alkenyl, an alkynyl, a cycloalkyl, an aryl, a silyl, a silylalkyl, an aminoalkyl, an alkoxyalkyl, or an aralkyl;

$L^1$, $L^2$, and $L^3$ are each independently an amide, an alkoxide, an acetylide, a carbamate, or a carboxylate. In some embodiments, the method comprises obtaining at least one co-reactant precursor. In some embodiments, the method comprises vaporizing the precursor to obtain a vaporized precursor. In some embodiments, the method comprises vaporizing the at least one co-reactant precursor to obtain at least one vaporized co-reactant precursor. In some embodiments, the method comprises contacting at least one of the vaporized precursor, the at least one vaporized co-reactant precursor, or any combination thereof, with a substrate, under vapor deposition conditions, to form a tin-containing film on the substrate.

In some embodiments, the precursor has a purity of at least 99%.

In some embodiments, R is $—CH_3$ or $—CH(CH_3)_2$.

In some embodiments, R is $—C_6H_5$.

In some embodiments, R is $—CH_2(C_6H_5)$.

In some embodiments, R is $—CH_2N(CH_3)_2$ or $—(CH_2)_3N(CH_3)_2$.

In some embodiments, R is $—CH_2CH_2OCH_3$.

In some embodiments, R is $—CH_2Si(CH_3)_3$.

In some embodiments, R is $—Si(CH_3)_3$.

In some embodiments, $L^1$, $L^2$ and $L^3$ are each independently at least one of the following:

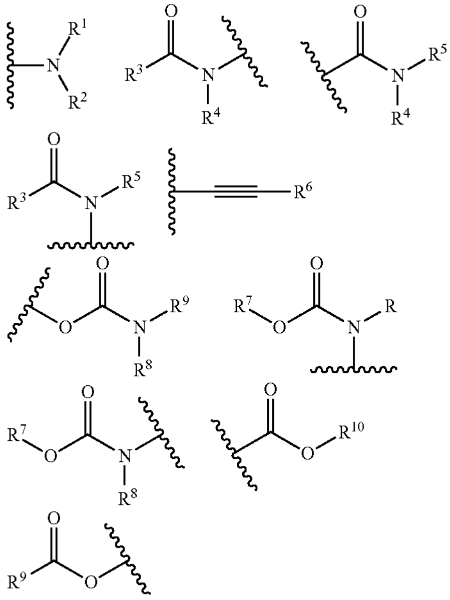

where:

$R^1$, $R^2$, $R^3$, $R^4$, $R^5$, $R^6$, $R^7$, $R^8$, $R^9$, and $R^{19}$ are each independently an alkyl, an alkenyl, an alkynyl, a cycloalkyl, an aryl, a silyl, a silylalkyl, an aminoalkyl, an alkoxyalkyl, or an aralkyl.

In some embodiments, $L^1$, $L^2$, or $L^3$ are $—N(CH_3)_2$.

In some embodiments, the precursor has the chemical structure:

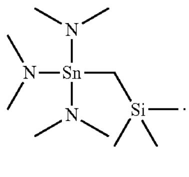

In some embodiments, the precursor has the chemical structure:

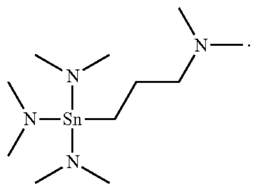

DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Figure 1:
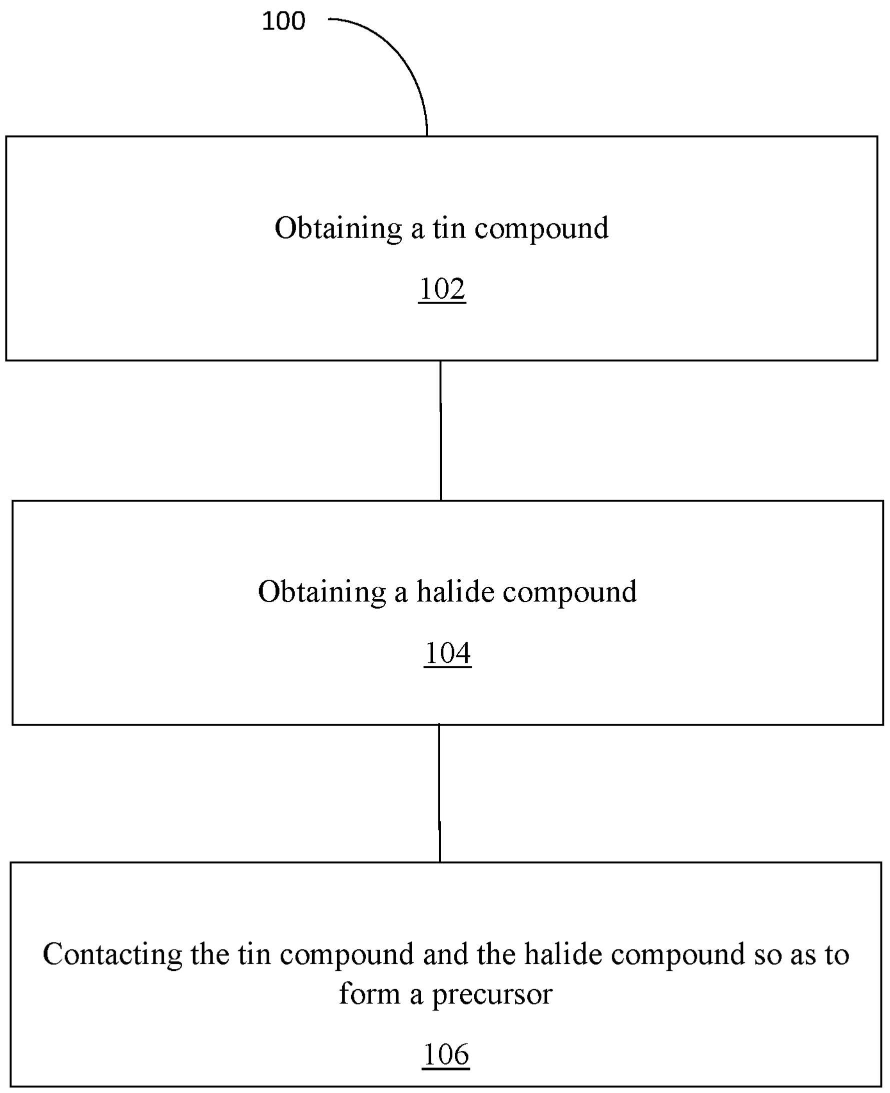
FIG. 1 is a flowchart of a method for preparing a precursor, according to some embodiments.

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Any prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, the term "alkyl" refers to a hydrocarbyl having from 1 to 30 carbon atoms. The alkyl may be attached via a single bond. An alkyl having n carbon atoms may be designated as a "$C_n$ alkyl." For example, a "$C_3$ alkyl" may include n-propyl and isopropyl. An alkyl having a range of carbon atoms, such as 1 to 30 carbon atoms, may be designated as a $C_1$-$C_{30}$ alkyl. In some embodiments, the alkyl is linear. In some embodiments, the alkyl is branched. In some embodiments, the alkyl is substituted. In some embodiments, the alkyl is unsubstituted. In some embodiments, the alkyl comprises or is selected from the group consisting of at least one of a $C_1$-$C_{30}$ alkyl, $C_1$-$C_{29}$ alkyl, $C_1$-$C_{28}$ alkyl, $C_1$-$C_{27}$ alkyl, $C_1$-$C_{27}$ alkyl, $C_1$-$C_{26}$ alkyl, $C_1$-$C_{25}$ alkyl, $C_1$-$C_{24}$ alkyl, $C_1$-$C_{23}$ alkyl, $C_1$-$C_{22}$ alkyl, $C_1$-$C_{21}$ alkyl, $C_1$-$C_{20}$ alkyl, $C_1$-$C_{19}$ alkyl, $C_1$-$C_{18}$ alkyl, $C_1$-$C_{17}$ alkyl, $C_1$-$C_{16}$ alkyl, $C_1$-$C_{15}$ alkyl, $C_1$-$C_{14}$ alkyl, $C_1$-$C_{13}$ alkyl, $C_1$-$C_{12}$ alkyl, $C_1$-$C_{11}$ alkyl, $C_1$-$C_{10}$ alkyl, a $C_1$-$C_9$ alkyl, a $C_1$-$C_8$ alkyl, a $C_1$-$C_7$ alkyl, a $C_1$-$C_6$ alkyl, a $C_1$-$C_5$ alkyl, a $C_1$-$C_4$ alkyl, a $C_1$-$C_3$ alkyl, a $C_1$-$C_2$ alkyl, a $C_2$-$C_{30}$ alkyl, a $C_3$-$C_{30}$ alkyl, a $C_4$-$C_{30}$ alkyl, a $C_5$-$C_{30}$ alkyl, a $C_6$-$C_{30}$ alkyl, a $C_7$-$C_{30}$ alkyl, a $C_8$-$C_{30}$ alkyl, a $C_9$-$C_{30}$ alkyl, a $C_{10}$-$C_{30}$ alkyl, a $C_{11}$-$C_{30}$ alkyl, a $C_{12}$-$C_{30}$ alkyl, a $C_{13}$-$C_{30}$ alkyl, a $C_{14}$-$C_{30}$ alkyl, a $C_{15}$-$C_{30}$ alkyl, a $C_{16}$-$C_{30}$ alkyl, a $C_{17}$-$C_{30}$ alkyl, a $C_{18}$-$C_{30}$ alkyl, a $C_{19}$-$C_{30}$ alkyl, a $C_{20}$-$C_{30}$ alkyl, a $C_{21}$-$C_{30}$ alkyl, a $C_{22}$-$C_{30}$ alkyl, a $C_{23}$-$C_{30}$ alkyl, a $C_{24}$-$C_{30}$ alkyl, a $C_{25}$-$C_{30}$ alkyl, a $C_{26}$-$C_{30}$ alkyl, a $C_{27}$-$C_{30}$ alkyl, a $C_{28}$-$C_{30}$ alkyl, a $C_{29}$-$C_{30}$ alkyl, a $C_2$-$C_{10}$ alkyl, a $C_3$-$C_{10}$ alkyl, a $C_4$-$C_{10}$ alkyl, a $C_5$-$C_{10}$ alkyl, a $C_6$-$C_{10}$ alkyl, a $C_7$-$C_{10}$ alkyl, a $C_8$-$C_{10}$ alkyl, a $C_2$-$C_9$ alkyl, a $C_2$-$C_8$ alkyl, a $C_2$-$C_7$ alkyl, a $C_2$-$C_6$ alkyl, a $C_2$-$C_5$ alkyl, a $C_3$-$C_5$ alkyl, or any combination thereof. In some embodiments, the alkyl comprises or is selected from the group consisting of at least one of methyl, ethyl, n-propyl, 1-methylethyl (iso-propyl), n-butyl, iso-butyl, sec-butyl, n-pentyl, 1,1-dimethylethyl (t-butyl), n-pentyl, iso-pentyl, n-hexyl, isohexyl, 3-methylhexyl, 2-methylhexyl, heptyl, octyl, nonyl, decyl, dodecyl, octadecyl, or any combination thereof. In some embodiments, the term "alkyl" refers generally to alkyls, alkenyls, alkynyls, and/or cycloalkyls.

As used herein, the term "alkenyl" refers to a hydrocarbyl having from 1 to 30 carbon atoms and at least one carbon-carbon double bond. In some embodiments, the alkenyl comprises or is selected from the group consisting of at least one of a $C_1$-$C_{30}$ alkenyl, $C_1$-$C_{29}$ alkenyl, $C_1$-$C_{28}$ alkenyl, $C_1$-$C_{27}$ alkenyl, $C_1$-$C_{27}$ alkenyl, $C_1$-$C_{26}$ alkenyl, $C_1$-$C_{25}$ alkenyl, $C_1$-$C_{24}$ alkenyl, $C_1$-$C_{23}$ alkenyl, $C_1$-$C_{22}$ alkenyl, $C_1$-$C_{21}$ alkenyl, $C_1$-$C_{29}$ alkenyl, $C_1$-$C_{19}$ alkenyl, $C_1$-$C_{18}$ alkenyl, $C_1$-$C_{17}$ alkenyl, $C_1$-$C_{16}$ alkenyl, $C_1$-$C_{15}$ alkenyl, $C_1$-$C_{14}$ alkenyl, $C_1$-$C_{13}$ alkenyl, $C_1$-$C_{12}$ alkenyl, $C_1$-$C_{11}$ alkenyl, $C_1$-$C_{10}$ alkenyl, a $C_1$-$C_9$ alkenyl, a $C_1$-$C_8$ alkenyl, a $C_1$-$C_7$ alkenyl, a $C_1$-$C_6$ alkenyl, a $C_1$-$C_5$ alkenyl, a $C_1$-$C_4$ alkenyl, a $C_1$-$C_3$ alkenyl, a $C_1$-$C_2$ alkenyl, a $C_2$-$C_{30}$ alkenyl, a $C_3$-$C_{30}$ alkenyl, a $C_4$-$C_{30}$ alkenyl, a $C_5$-$C_{30}$ alkenyl, a $C_6$-$C_{30}$ alkenyl, a $C_7$-$C_{30}$ alkenyl, a $C_8$-$C_{30}$ alkenyl, a $C_9$-$C_{30}$ alkenyl, a $C_{10}$-$C_{30}$ alkenyl, a $C_{11}$-$C_{30}$ alkenyl, a $C_{12}$-$C_{30}$ alkenyl, a $C_{13}$-$C_{30}$ alkenyl, a $C_{14}$-$C_{30}$ alkenyl, a $C_{15}$-$C_{30}$ alkenyl, a $C_{16}$-$C_{30}$ alkenyl, a $C_{17}$-$C_{30}$ alkenyl, a $C_{18}$-$C_{30}$ alkenyl, a $C_{19}$-$C_{30}$ alkenyl, a $C_{20}$-$C_{30}$ alkenyl, a $C_{21}$-$C_{30}$ alkenyl, a $C_{22}$-$C_{30}$ alkenyl, a $C_{23}$-$C_{30}$ alkenyl, a $C_{24}$-$C_{30}$ alkenyl, a $C_{25}$-$C_{30}$ alkenyl, a $C_{26}$-$C_{30}$ alkenyl, a $C_{27}$-$C_{30}$ alkenyl, a $C_{28}$-$C_{30}$ alkenyl, a $C_{29}$-$C_{30}$ alkenyl, a $C_2$-$C_{10}$ alkenyl, a $C_3$-$C_{10}$ alkenyl, a $C_4$-$C_{10}$ alkenyl, a $C_5$-$C_{10}$ alkenyl, a $C_6$-$C_{10}$ alkenyl, a $C_7$-$C_{10}$ alkenyl, a $C_8$-$C_{10}$ alkenyl, a $C_2$-$C_9$ alkenyl, a $C_2$-$C_8$ alkenyl, a $C_2$-$C_7$ alkenyl, a $C_2$-$C_6$ alkenyl, a $C_2$-$C_5$ alkenyl, a $C_3$-$C_5$ alkenyl, or any combination thereof. Examples of alkenyl groups include, without limitation, at least one of vinyl, allyl, 1-methylvinyl, 1-propenyl, 1-butenyl, 2-butenyl, 3-butenyl, 1,3-butadienyl, 2-methyl-1-propenyl, 2-methyl-2-propenyl, 1-pentenyl, 2-pentenyl, 3-pentenyl, 4-pentenyl, 1,3-pentadienyl, 2,4-pentadienyl, 1,4-pentadienyl, 3-methyl-2-butenyl, 1-hexenyl, 2-hexenyl, 3-hexenyl, 1,3-hexadienyl, 1,4-hexadienyl, 2-methylpentenyl, 1-heptenyl, 3-heptenyl, 1-octenyl, 1,3-octadienyl, 1-nonenyl, 2-nonenyl, 3-nonenyl, 1-decenyl, 3-decenyl, 1-undecenyl, oleyl, linoleyl, linolenyl, or any combination thereof.

As used herein, the term "alkynyl" refers to a hydrocarbyl having from 1 to 30 carbon atoms and at least one carbon-carbon triple bond. In some embodiments, the alkynyl comprises or is selected from the group consisting of at least one of a $C_1$-$C_{30}$ alkynyl, $C_1$-$C_{29}$ alkynyl, $C_1$-$C_{28}$ alkynyl, $C_1$-$C_{27}$ alkynyl, $C_1$-$C_{27}$ alkynyl, $C_1$-$C_{26}$ alkynyl, $C_1$-$C_{25}$ alkynyl, $C_1$-$C_{24}$ alkynyl, $C_1$-$C_{23}$ alkynyl, $C_1$-$C_{22}$ alkynyl, $C_1$-$C_{21}$ alkynyl, $C_1$-$C_{20}$ alkynyl, $C_1$-$C_{19}$ alkynyl, $C_1$-$C_{18}$ alkynyl, $C_1$-$C_{17}$ alkynyl, $C_1$-$C_{16}$ alkynyl, $C_1$-$C_{15}$ alkynyl, $C_1$-$C_{14}$ alkynyl, $C_1$-$C_{13}$ alkynyl, $C_1$-$C_{12}$ alkynyl, $C_1$-$C_{11}$ alkynyl, $C_1$-$C_{10}$ alkynyl, a $C_1$-$C_9$ alkynyl, a $C_1$-$C_8$ alkynyl, a $C_1$-$C_7$ alkynyl, a $C_1$-$C_6$ alkynyl, a $C_1$-$C_5$ alkynyl, a $C_1$-$C_4$ alkynyl, a $C_1$-$C_3$ alkynyl, a $C_1$-$C_2$ alkynyl, a $C_2$-$C_{30}$ alkynyl, a $C_3$-$C_{30}$ alkynyl, a $C_4$-$C_{30}$ alkynyl, a $C_5$-$C_{30}$ alkynyl, a $C_6$-$C_{30}$ alkynyl, a $C_7$-$C_{30}$ alkynyl, a $C_8$-$C_{30}$ alkynyl, a $C_9$-$C_{30}$ alkynyl, a $C_{10}$-$C_{30}$ alkynyl, a $C_{11}$-$C_{30}$ alkynyl, a $C_{12}$-$C_{30}$ alkynyl, a $C_{13}$-$C_{30}$ alkynyl, a $C_{14}$-$C_{30}$ alkynyl, a $C_{15}$-$C_{30}$ alkynyl, a $C_{16}$-$C_{30}$ alkynyl, a $C_{17}$-$C_{30}$ alkynyl, a $C_{18}$-$C_{30}$ alkynyl, a $C_{19}$-$C_{30}$ alkynyl, a $C_{20}$-$C_{30}$ alkynyl, a $C_{21}$-$C_{30}$ alkynyl, a $C_{22}$-$C_{30}$ alkynyl, a $C_{23}$-$C_{30}$ alkynyl, a $C_{24}$-$C_{30}$ alkynyl, a $C_{25}$-$C_{30}$ alkynyl, a $C_{26}$-$C_{30}$ alkynyl, a $C_{27}$-$C_{30}$ alkynyl, a $C_{28}$-$C_{30}$ alkynyl, a $C_{29}$-$C_{30}$ alkynyl, a $C_2$-$C_{10}$ alkynyl, a $C_3$-$C_{10}$ alkynyl, a $C_4$-$C_{10}$ alkynyl, a $C_5$-$C_{10}$ alkynyl, a $C_6$-$C_{10}$ alkynyl, a $C_7$-$C_{10}$ alkynyl, a $C_8$-$C_{10}$ alkynyl, a $C_2$-$C_9$ alkynyl, a $C_2$-$C_8$ alkynyl, a $C_2$-$C_7$ alkynyl, a $C_2$-$C_6$ alkynyl, a $C_2$-$C_5$ alkynyl, a $C_3$-$C_5$ alkynyl, or any combination thereof. Examples of alkynyl groups include, without limitation, at least one of ethynyl, propynyl, n-butynyl, n-pentynyl, 3-methyl-1-butynyl, n-hexynyl, methyl-pentynyl, or any combination thereof.

As used herein, the term "cycloalkyl" refers to a non-aromatic carbocyclic ring having from 3 to 8 carbon atoms in the ring. The term includes a monocyclic non-aromatic carbocyclic ring and a polycyclic non-aromatic carbocyclic ring. The term "monocyclic," when used as a modifier, refers to a cycloalkyl having a single cyclic ring structure. The term "polycyclic," when used as a modifier, refers to a cycloalkyl having more than one cyclic ring structure, which may be fused, bridged, spiro, or otherwise bonded ring structures. For example, two or more cycloalkyls may be fused, bridged, or fused and bridged to obtain the polycyclic non-aromatic carbocyclic ring. In some embodiments, the cycloalkyl may comprise, consist of, or consist essentially of, or may be selected from the group consisting of, at least one of cyclopropyl, cyclobutyl, cyclopentyl, cyclohexyl, cycloheptyl, cyclooctyl, or any combination thereof.

As used herein, the term "aryl" refers to a monocyclic or polycyclic aromatic hydrocarbon. The number of carbon atoms of the aryl may be in a range of 5 carbon atoms to 100 carbon atoms. In some embodiments, the aryl has 5 to 20 carbon atoms. For example, in some embodiments, the aryl has 6 to 8 carbon atoms, 6 to 10 carbon atoms, 6 to 12 carbon atoms, 6 to 15 carbon atoms, or 6 to 20 carbon atoms. The term "monocyclic," when used as a modifier, refers to an aryl having a single aromatic ring structure. The term "polycyclic," when used as a modifier, refers to an aryl having more than one aromatic ring structure, which may be fused, bridged, spiro, or otherwise bonded ring structures. In some embodiments, the aryl is $—C_6H_5$.

As used herein, the term "alkoxy" refers to a functional group of formula $—OR^a$, wherein $R^a$ is an alkyl, as defined herein. In some embodiments, the alkoxy may comprise, consist of, or consist essentially of, or may selected from the group consisting of, at least one of methoxy, ethoxy, methoxy, ethoxy, n-propoxy, 1-methylethoxy (isopropoxy), n-butoxy, iso-butoxy, sec-butoxy, tert-butoxy, or any combination thereof.

As used herein, the terms "amine" and "amino" refer to a functional group of formula $—N(R^bR^cR^d)$, wherein each of $R^b$, $R^c$, and $R^d$ is independently a hydrogen or an alkyl, as defined herein. In some embodiments, the amine may comprise, consist of, or consist essentially of a primary amine, a secondary amine, a tertiary amine, or a quaternary amine. In some embodiments, the amine may comprise, consist of, or consist essentially of an alkyl amine, a dialkylamine, or a trialkyl amine. In some embodiments, the amine may comprise, consist of, or consist essentially of, or may be selected from the group consisting of, at least one of methyl amine, dimethylamine, ethylamine, diethylamine, isopropylamine, di-isopropylamine, butylamine, sec-butylamine, tert-butylamine, di-sec-butylamine, isobutylamine, di-isobutylamine, di-tert-pentylamine, ethylmethylamine, isopropyl-n-propylamine, or any combination thereof. Examples of the alkylamines may include, without limitation, one or more of the following: primary alkylamines, such as, for example and without limitation, methylamine, ethylamine, n-propylamine, isopropylamine, n-butylamine, sec-butylamine, isobutylamine, t-butylamine, pentylamine, 2-aminopentane, 3-aminopentane, 1-amino-2-methylbutane, 2-amino-2-methylbutane, 3-amino-2-methylbutane, 4-amino-2-methylbutane, hexylamine, 5-amino-2-methylpentane, heptylamine, octylamine, nonylamine, decylamine, undecylamine, dodecylamine, tridecylamine, tetradecylamine, pentadecylamine, hexadecylamine, heptadecylamine, and octadecylamine; and secondary alkylamines, such as, for example and without limitation, dimethylamine, diethylamine, dipropylamine, diisopropylamine, dibutylamine, diisobutylamine, di-sec-butylamine, di-t-butylamine, dipentylamine, dihexylamine, diheptylamine, dioctylamine, dinonylamine, didecylamine, methylethylamine, methylpropylamine, methylisopropylamine, methylbutylamine, methylisobutylamine, methyl-sec-butylamine, methyl-t-butylamine, methylamylamine, methylisoamylamine, ethylpropylamine, ethylisopropylamine, ethylbutylamine, ethylisobutylamine, ethyl-sec-butylamine, ethylamine, ethylisoamylamine, propylbutylamine, and propylisobutylamine. In some embodiments, the amine is $—N(CH_3)_2$.

As used herein, the term "silyl" refers to a functional group of formula $—Si(R^eR^fR^g)$, where each of $R^e$, $R^f$, and $R^g$ is independently a hydrogen or an alkyl, as defined herein. In some embodiments, the silyl is a functional group of formula $—SiH_3$. In some embodiments, the silyl is a functional group of formula $—SiR^eH_2$, where $R^e$ is not hydrogen. In some embodiments, the silyl is a functional group of formula $—SiR^eR^fH$, where $R^e$ and $R^f$ are not hydrogen. In some embodiments, the silyl is a functional group of the formula $—Si(R^eR^fR^g)$, where $R^e$, $R^f$, and $R^g$ are not hydrogen. In some embodiments, the silyl is a functional group of formula $—Si(CH_3)_3$.

As used herein, the term "alkoxyalkyl" refers to an alkyl as defined herein, wherein at least one of the hydrogen atoms of the alkyl is replaced with an alkoxy as defined herein. In some embodiments, the term "alkoxyalkyl" refers to a functional group of formula $-(alkyl)OR^a$, wherein the alkyl is defined above and wherein the $R^a$ is defined above. In some embodiments, the alkoxyalkyl is a functional group of formula $—(CH_2)_nOR^a$, where n is 1 to 10 and $R^a$ is defined above. In some embodiments, the alkoxyalkyl is a functional group of the formula $—CH_2CH_2OCH_3$.

As used herein, the term "aralkyl" refers to an alkyl as defined herein, wherein at least one of the hydrogen atoms of the alkyl is replaced with an aryl as defined herein. In some embodiments, the term "aralkyl" refers to a functional group of formula -(alkyl)(aryl), wherein the alkyl is defined herein and the aryl is defined herein. In some embodiments, the aralkyl is $—CH_2(C_6H_5)$.

As used herein, the term "aminoalkyl" refers to an alkyl as defined herein, wherein at least one of the hydrogen atoms of the alkyl is replaced with an amino as defined herein. In some embodiments, the term "aminoalkyl" refers to a functional group of formula -(alkyl)N($R^bR^cR^d$), wherein the alkyl is defined above and wherein $R^b$, $R^c$, and $R^d$ are defined above. In some embodiments, the aminoalkyl is $—CH_2N(CH_3)_2$. In some embodiments, the aminoalkyl is $—(CH_2)_3N(CH_3)_2$. In some embodiments, the aminoalkyl is aminomethyl ($—CH_2NH_2$). In some embodiments, the aminoalkyl is N,N-dimethylaminoethyl ($—CH_2CH_2N(CH_3)_2$). In some embodiments, the aminoalkyl is 3-(N-cyclopropylamino)propyl ($—CH_2CH_2CH_2NH—Pr$).

As used herein, the term "silylalkyl" refers to an alkyl as defined herein, wherein at least one of the hydrogen atoms of the alkyl is replaced with a silyl as defined herein. In some embodiments, the term "silylalkyl" refers to a functional group of formula -(alkyl)Si($R^eR^fR^g$), wherein the alkyl is defined above and wherein $R^e$, $R^f$, and $R^g$ are defined above. In some embodiments, the silylalky is a functional group of formula $—(CH_2)_mSi(R^eR^fR^g)$, where m is 1 to 10 and where $R^e$, $R^f$, and $R^g$ are defined above. In some embodiments, the silylalkyl is a functional group of formula $—CH_2Si(CH_3)_3$.

As used herein, the term "halide" refers to a —Cl, —Br, —I, or —F.

Some embodiments relate to precursor compositions and related methods. The precursor compositions disclosed herein include precursors substituted with alkyls and precursors substituted with silyls, among others. The precursor compositions may be used to form tin-containing films useful in the fabrication of microelectronic devices, including semiconductor devices. For example, the precursor compositions may be used to form functionalized tin oxide films ($RSnO_x$). The functionalized tin oxide films may be used in dry resist applications or as reflective coatings for extreme-ultraviolet (EUV) lithography, among others. The precursor compositions may be formed according to the methods disclosed herein in high yield and high purity, while also minimizing the number of steps required to produce the precursor compositions.

The tin-containing films may also be formed according to the methods disclosed herein. That is, the tin-containing films disclosed herein may be formed by one or more deposition processes that utilize the precursor compositions. Examples of deposition processes include, without limitation, at least one of a chemical vapor deposition (CVD) process, a digital or pulsed chemical vapor deposition process, a plasma-enhanced cyclical chemical vapor deposition process (PECCVD), a flowable chemical vapor deposition process (FCVD), an atomic layer deposition (ALD) process, a thermal atomic layer deposition, a plasma-enhanced atomic layer deposition (PEALD) process, a metal organic chemical vapor deposition (MOCVD) process, a plasma-enhanced chemical vapor deposition (PECVD) process, or any combination thereof.

A precursor composition may comprise a precursor. In some embodiments, the precursor is a functionalized tin compound in which one or more ligands are coordinated to tin (Sn). In some embodiments, the tin compound is functionalized with an alkyl group, wherein the alkyl group may be saturated or unsaturated, cyclic or acyclic, and substituted or unsubstituted. In some embodiments, the tin compound is functionalized with a silyl group. The functional groups may comprise one or more substituents. In some embodiments, the substituents comprise at least one of a nitrogen, a silicon, an oxygen, a chlorine, a bromine, a fluorine, an iodine, a nitrile, an imine, a carbonyl, or any combination thereof.

In some embodiments, the precursor composition comprises a precursor of the formula:

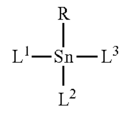

where:

R is a functional group; and $L^1$, $L^2$, and $L^3$ are ligands coordinated to Sn.

In some embodiments, R is a hydrocarbyl. In some embodiments, R is a hydrosilyl. In some embodiments, R is at least one of an alkyl, an alkenyl, an alkynyl, a cycloalkyl, an aryl, a silyl, a silylalkyl, an aminoalkyl, an alkoxyalkyl, an aralkyl, or any combination thereof. In some embodiments, R is an alkyl. In some embodiments, R is an alkenyl. In some embodiments, R is an alkynyl. In some embodiments, R is a cycloalkyl. In some embodiments, R is an aryl. In some embodiments, R is a silyl. In some embodiments, R is a silylalkyl. In some embodiments, R is an aminoalkyl. In some embodiments, R is an alkoxyalkyl. In some embodiments, R is an aralkyl. In some embodiments, R comprises a halide. In some embodiments, R comprises at least one of a nitrile, an imine, a carbonyl, a nitrogen, a silicon, an oxygen, a chlorine, a bromine, a fluorine, an iodine, or any combination thereof.

In some embodiments, $L^1$, $L^2$, and $L^3$ are each independently an amide, an alkoxide, an acetylide, a carbamate, or a carboxylate. In some embodiments, $L^1$, $L^2$, and $L^3$ are each independently an amine, an alkoxy, an alkenyl, an alkynyl, a carbamate, or a carboxyl. In some embodiments, $L^1$, $L^2$, and $L^3$ are each independently at least one of the following:

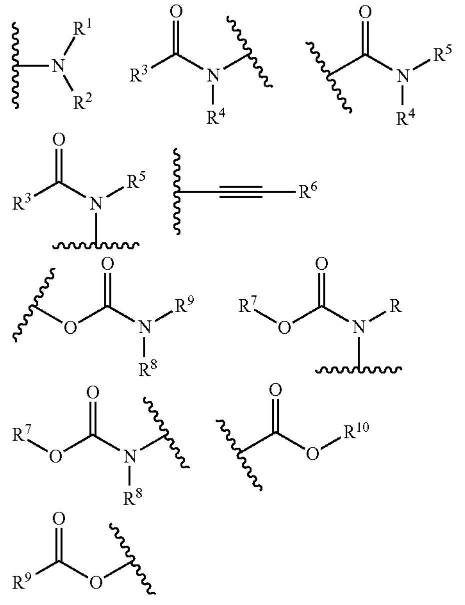

where:

$R^1$, $R^2$, $R^3$, $R^4$, $R^5$, $R^6$, $R^7$, $R^8$, $R^9$, and $R^{19}$ are each independently an alkyl, an alkenyl, an alkynyl, a cycloalkyl, an aryl, a silyl, a silylalkyl, an aminoalkyl, an alkoxyalkyl, or an aralkyl.

In some embodiments, the precursor composition comprises a precursor of the formula:

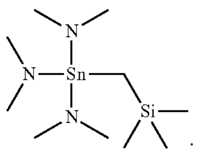

In some embodiments, the precursor composition comprises a precursor of the formula:

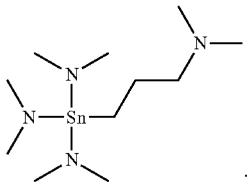

FIG. 1 is a flowchart of a method 100 for preparing a precursor, according to some embodiments. As shown in FIG. 1, the method 100 for preparing a precursor may comprise one or more of the following steps: a step 102 of obtaining a tin compound; a step 104 of obtaining a halide compound; and a step 106 of contacting the tin compound and the halide compound so as to form a precursor. In some embodiments, the precursor has the formula:

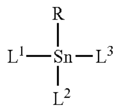

where:

R is a functional group; and $L^1$, $L^2$, and $L^3$ are ligands coordinated to Sn.

In some embodiments, the tin compound comprises at least one compound of the formula: $SnL_2$, wherein each L is independently $L^1$, $L^2$, or $L^3$.

In some embodiments, $L^1$, $L^2$, and $L^3$ are each independently at least one of an amide, an alkoxide, an acetylide, a carbamate, a carboxylate, or any combination thereof. In some embodiments, $L^1$, $L^2$, and $L^3$ are each independently at least one of an amine, an alkoxy, an alkenyl, an alkynyl, a carbamate, a carboxyl, or any combination thereof. In some embodiments, $L^1$, $L^2$, and $L^3$ are each independently at least one of the following:

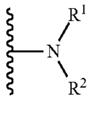 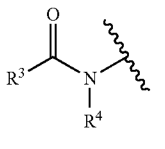 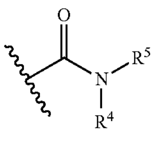

-continued

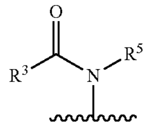 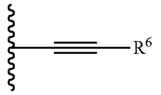

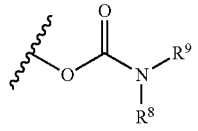 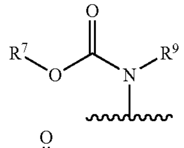

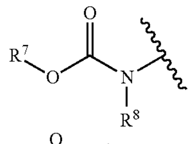 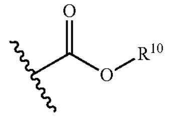

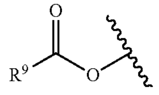

where:

$R^1$, $R^2$, $R^3$, $R^4$, $R^5$, $R^6$, $R^7$, $R^8$, $R^9$, and $R^{19}$ are each independently an alkyl, an alkenyl, an alkynyl, a cycloalkyl, an aryl, a silyl, a silylalkyl, an aminoalkyl, an alkoxyalkyl, or an aralkyl.

In some embodiments, the halide compound is a compound of the formula:

X—R where:

R is an alkyl, an alkenyl, an alkynyl, a cycloalkyl, an aryl, a silyl, a silylalkyl, an aminoalkyl, an alkoxyalkyl, or an aralkyl;

X is Cl, Br, F, or I.

In some embodiments, the contacting comprises bringing into direct contact, or immediate or close proximity. In some embodiments, the contacting comprises combining or adding to a reaction flask, a reaction vial, or a reactor. In some embodiments, the contacting comprises at least one of diluting the tin compound, diluting the halide compound, dissolving the tin compound, dissolving the halide compound, stirring the tin compound, stirring the halide compound, or any combination thereof. In some embodiments, the contacting comprises adding the halide compound dropwise to the tin compound. In some embodiments, the contacting comprises adding the tin compound dropwise to the halide compound. In some embodiments, the contacting is performed under heating.

In some embodiments, the contacting is performed under heating at or to a temperature in a range of 30° C. to 150° C. In some embodiments, the heating is performed at or to a temperature in a range of 30° C. to 140° C., 30° C. to 130° C., 30° C. to 120° C., 30° C. to 110° C., 30° C. to 100° C., 30° C. to 90° C., 30° C. to 80° C., 30° C. to 70° C., 30° C. to 60° C., 30° C. to 50° C., 30° C. to 40° C., 40° C. to 150° C., 50° C. to 150° C., 60° C. to 150° C., 70° C. to 150° C., 80° C. to 150° C., 90° C. to 150° C., 100° C. to 150° C., 110° C. to 150° C., 120° C. to 150° C., 130° C. to 150° C., or 140° C. to 150° C.

In some embodiments, the contacting is a performed in a solvent. In some embodiments, the solvent comprises hexane.

In some embodiments, the precursor is formed according to the following reaction scheme:

$$SnL_2 \xrightarrow{R-X} RSnL_3 + [LSnX]_2$$

where:

R is defined above;

X is defined above; and each L is independently $L^1$, $L^2$, or $L^3$.

Figure 2:
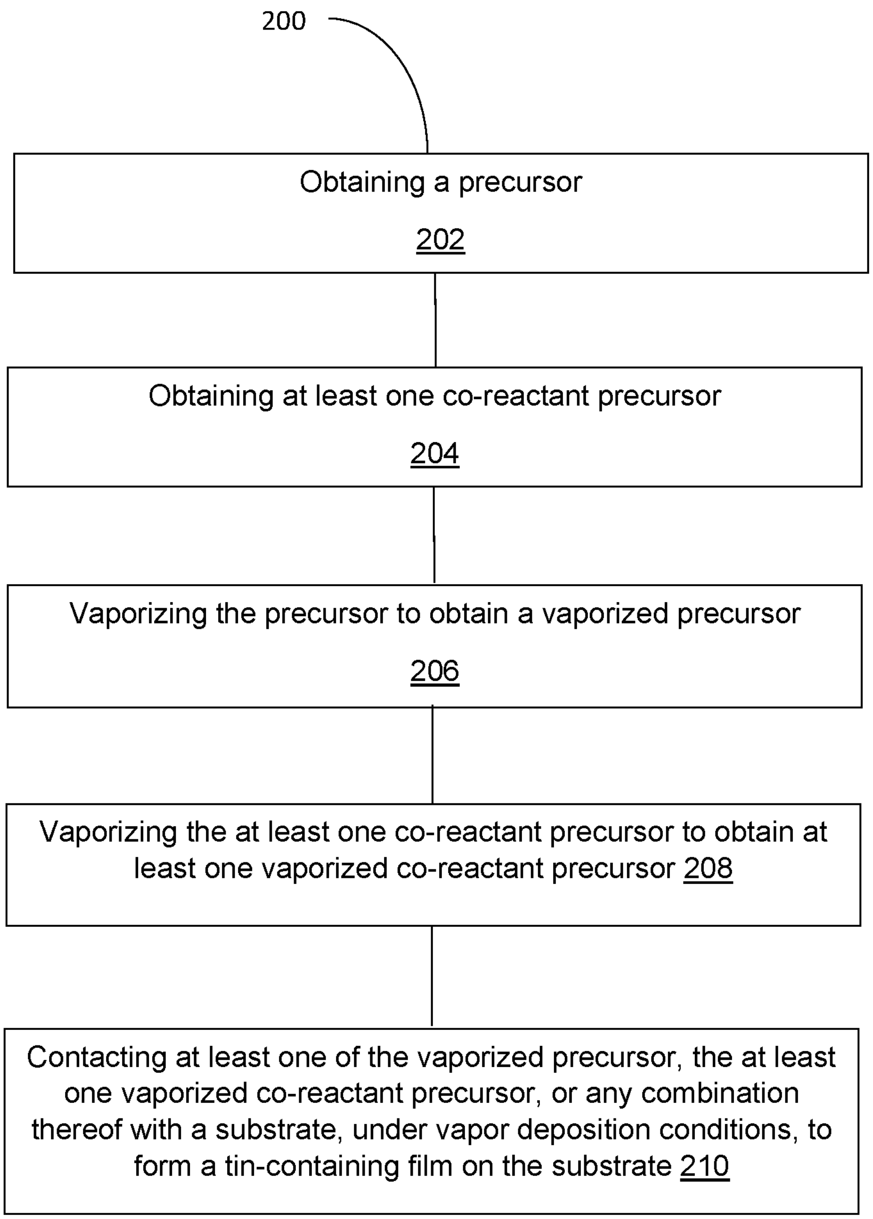
FIG. 2 is a flowchart of a method for making a tin-containing film, according to some embodiments.

FIG. 2 is a flowchart of a method for making a tin-containing film 200, according to some embodiments. As shown in FIG. 2, the method for making a tin-containing film 200 may comprise, consist of, or consist essentially of one or more of the following steps: obtaining 202 a precursor, obtaining 204 at least one co-reactant precursor, vaporizing 206 the precursor to obtain a vaporized precursor, vaporizing 208 the at least one co-reactant precursor to obtain at least one vaporized co-reactant precursor, contacting 210 at least one of the vaporized precursor, the at least one vaporized co-reactant precursor, or any combination thereof with a substrate, under vapor deposition conditions, to form a tin-containing film on the substrate.

The step 202 may comprise, consist of, or consist essentially of obtaining a precursor. The precursor may comprise, consist of, or consist essentially of any one or more of the precursors disclosed herein. The obtaining may comprise obtaining a container or other vessel comprising the precursor. In some embodiments, the precursor may be obtained in a container or other vessel in which the precursor is to be vaporized.

The step 204 may comprise, consist of, or consist essentially of obtaining at least one co-reactant precursor. In some embodiments, the at least one co-reactant precursor comprises, consists of, or consists essentially of, or is selected from the group consisting of, at least one of an oxidizing gas, a reducing gas, a hydrocarbon, or any combination thereof. The at least one co-reactant precursor may be selected to obtain a desired tin-containing film. In some embodiments, the at least one co-reactant precursor may comprise, consist of, or consist essentially of at least one of $N_2$, $H_2$, $NH_3$, $N_2H_4$, $CH_3HNNH_2$, $CH_3HNNHCH_3$, $NCH_3H_2$, $NCH_3CH_2H_2$, $N(CH_3)_2H$, $N(CH_3CH_2)_2H$, $N(CH_3)_3$, $N(CH_3CH_2)_3$, $Si(CH_3)_2NH$, pyrazoline, pyridine, ethylene diamine, or any combination thereof. In some embodiments, the at least one co-reactant precursor may comprise, consist of, or consist essentially of at least one of $H_2$, $O_2$, $O_3$, $H_2O$, $H_2O_2$, NO, $N_2O$, $NO_2$, CO, $CO_2$, a carboxylic acid, an alcohol, a diol, or any combination thereof. In some embodiments, the at least one co-reactant precursor comprise, consist of, or consist essentially of at least one of methane, ethane, ethylene, acetylene, or any combination thereof. The obtaining may comprise obtaining a container or other vessel comprising the at least one co-reactant precursor. In some embodiments, the at least one co-reactant precursor may be obtained in a container or other vessel in which the at least one co-reactant precursor is to be vaporized. In some embodiments, the method further comprises an inert gas, such as, for example, at least one of argon, helium, nitrogen, or any combination thereof.

The step 206 may comprise, consist of, or consist essentially of vaporizing the precursor to obtain a vaporized precursor. The vaporizing may comprise, consist of, or consist essentially of heating the precursor sufficient to obtain the vaporized precursor. In some embodiments, the vaporizing may comprise, consist of, or consist essentially of heating a container comprising the precursor. In some embodiments, the vaporizing may comprise, consist of, or consist essentially of heating the precursor in a deposition chamber in which the vapor deposition process is performed. In some embodiments, the vaporizing may comprise, consist of, or consist essentially of heating a conduit for delivering the precursor, vaporized precursor, or any combination thereof to, for example, a deposition chamber. In some embodiments, the vaporizing may comprise, consist of, or consist essentially of operating a vapor delivery system comprising the precursor. In some embodiments, the vaporizing may comprise, consist of, or consist essentially of heating to a temperature sufficient to vaporize the precursor to obtain the vaporized precursor. In some embodiments, the vaporizing may comprise, consist of, or consist essentially of heating to a temperature below a decomposition temperature of at least one of the precursor, the vaporized precursor, or any combination thereof. In some embodiments, the precursor may be present in a gas phase, in which case the step 206 is optional and not required. For example, the precursor may comprise, consist of, or consist essentially of the vaporized precursor.

The step 208 may comprise, consist of, or consist essentially of vaporizing the at least one co-reactant precursor to obtain the at least one vaporized co-reactant precursor. In some embodiments, the vaporizing may comprise, consist of, or consist essentially of heating the at least one co-reactant precursor sufficient to obtain the at least one vaporized co-reactant precursor. In some embodiments, the vaporizing may comprise, consist of, or consist essentially of heating a container comprising the at least one co-reactant precursor. In some embodiments, the vaporizing may comprise, consist of, or consist essentially of heating the at least one co-reactant precursor in a deposition chamber in which the vapor deposition process is performed. In some embodiments, the vaporizing may comprise, consist of, or consist essentially of heating a conduit for delivering the at least one co-reactant precursor, the at least one vaporized co-reactant precursor, or any combination thereof to, for example, a deposition chamber. In some embodiments, the vaporizing may comprise, consist of, or consist essentially of operating a vapor delivery system comprising the at least one co-reactant precursor. In some embodiments, the vaporizing may comprise, consist of, or consist essentially of heating to a temperature sufficient to vaporize the at least one co-reactant precursor to obtain the at least one vaporized co-reactant precursor. In some embodiments, the vaporizing may comprise, consist of, or consist essentially of heating to a temperature below a decomposition temperature of at least one of the at least one co-reactant precursor, the at least one vaporized co-reactant precursor, or any combination thereof. In some embodiments, the at least one co-reactant precursor may be present in a gas phase, in which case the step 108 is optional and not required. For example, the at least one co-reactant precursor may comprise, consist of, or consist essentially of the at least one vaporized co-reactant precursor.

The step 210 may comprise, consist of, or consist essentially of contacting at least one of the vaporized precursor, the at least one vaporized co-reactant precursor, or any combination thereof, with the substrate, under vapor deposition conditions, sufficient to form a tin-containing film on a surface of the substrate. The contacting may be performed in any system, apparatus, device, assembly, chamber thereof, or component thereof suitable for vapor deposition processes, including, for example and without limitation, a deposition chamber, among others. The vaporized precursor and the at least one co-reactant precursor may be contacted with the substrate at the same time or at different times. For example, each of the vaporized precursor, the at least one vaporized co-reactant precursor, and the substrate may be present in the deposition chamber at the same time. That is, in some embodiments, the contacting may comprise contemporaneous contacting or simultaneous contacting of the vaporized precursor and the at least one vaporized co-reactant precursor with the substrate. Alternatively, each of the vaporized precursor and the at least one vaporized co-reactant precursor may be present in the deposition chamber at different times. That is, in some embodiments, the contacting may comprise alternate and/or sequential contacting, in one or more cycles, of the vaporized precursor with the substrate and subsequently contacting the at least one vaporized co-reactant precursor with the substrate.

The vapor deposition conditions may comprise conditions for vapor deposition processes. Examples of vapor deposition conditions include, without limitation, vapor deposition conditions for vapor deposition processes including at least one of a chemical vapor deposition (CVD) process, a digital or pulsed chemical vapor deposition process, a plasma-enhanced cyclical chemical vapor deposition process (PECCVD), a flowable chemical vapor deposition process (FCVD), an atomic layer deposition (ALD) process, a thermal atomic layer deposition, a plasma-enhanced atomic layer deposition (PEALD) process, a metal organic chemical vapor deposition (MOCVD) process, a plasma-enhanced chemical vapor deposition (PECVD) process, or any combination thereof.

The vapor deposition conditions may comprise, consist of, or consist essentially of a deposition temperature. The deposition temperature may be a temperature less than the thermal decomposition temperature of at least one of the vaporized precursor, the at least one vaporized co-reactant precursor, or any combination thereof. The deposition temperature may be sufficiently high to reduce or avoid condensation of at least one of the vaporized precursor, the at least one vaporized co-reactant precursor, or any combination thereof. In some embodiments, the substrate may be heated to the deposition temperature. In some embodiments, the chamber or other vessel in which the substrate is contacted with the vaporized precursor and the at least one vaporized co-reactant precursor is heated to the deposition temperature. In some embodiments, at least one of the vaporized precursor, the at least one vaporized co-reactant precursor, or any combination thereof may be heated to the deposition temperature.

The deposition temperature may be a temperature of 200° C. to 2500° C. In some embodiments, the deposition temperature may be a temperature of 500° C. to 700° C. For example, in some embodiments, the deposition temperature may be a temperature of 500° C. to 680° C., 500° C. to 660° C., 500° C. to 640° C., 500° C. to 620° C., 500° C. to 600° C., 500° C. to 580° C., 500° C. to 560° C., 500° C. to 540° C., 500° C. to 520° C., 520° C. to 700° C., 540° C. to 700° C., 560° C. to 700° C., 580° C. to 700° C., 600° C. to 700° C., 620° C. to 700° C., 640° C. to 700° C., 660° C. to 700° C., or 680° C. to 700° C. In other embodiments, the deposition temperature may be a temperature of greater than 200° C. to 2500° C., such as, for example and without limitation, a temperature of 400° C. to 2000, 500° C. to 2000° C., 550° C. to 2400° C., 600° C. to 2400° C., 625° C. to 2400° C., 650° C. to 2400° C., 675° C. to 2400° C., 700° C. to 2400° C., 725° C. to 2400° C., 750° C. to 2400° C., 775° C. to 2400° C., 800° C. to 2400° C., 825° C. to 2400° C., 850° C. to 2400° C., 875° C. to 2400° C., 900° C. to 2400° C., 925° C. to 2400° C., 950° C. to 2400° C., 975° C. to 2400° C., 1000° C. to 2400° C., 1025° C. to 2400° C., 1050° C. to 2400° C., 1075° C. to 2400° C., 1100° C. to 2400° C., 1200° C. to 2400° C., 1300° C. to 2400° C., 1400° C. to 2400° C., 1500° C. to 2400° C., 1600° C. to 2400° C., 1700° C. to 2400° C., 1800° C. to 2400° C., 1900° C. to 2400° C., 2000° C. to 2400° C., 2100° C. to 2400° C., 2200° C. to 2400° C., 2300° C. to 2400° C., 500° C. to 2000° C., 500° C. to 1900° C., 500° C. to 1800° C., 500° C. to 1700° C., 500° C. to 1600° C., 500° C. to 1500° C., 500° C. to 1400° C., 500° C. to 1300° C., 500° C. to 1200° C., 500° C. to 1100° C., 500° C. to 1000° C., 500° C. to 1000° C., 500° C. to 900° C., or 500° C. to 800° C.

The vapor deposition conditions may comprise, consist of, or consist essentially of a deposition pressure. In some embodiments, the deposition pressure may comprise, consist of, or consist essentially of a vapor pressure of at least one of the vaporized precursor, the at least one vaporized co-reactant precursor, or any combination thereof. In some embodiments, the deposition pressure may comprise, consist of, or consist essentially of a chamber pressure.

The deposition pressure may be a pressure of 0.001 Torr to 100 Torr. For example, in some embodiments, the deposition pressure may be a pressure of 1 Torr to 30 Torr, 1 Torr to 25 Torr, 1 Torr to 20 Torr, 1 Torr to 15 Torr, 1 Torr to 10 Torr, 5 Torr to 50 Torr, 5 Torr to 40 Torr, 5 Torr to 30 Torr, 5 Torr to 20 Torr, or 5 Torr to 15 Torr. In other embodiments, the deposition pressure may be a pressure of 1 Torr to 100 Torr, 5 Torr to 100 Torr, 10 Torr to 100 Torr, 15 Torr to 100 Torr, 20 Torr to 100 Torr, 25 Torr to 100 Torr, 30 Torr to 100 Torr, 35 Torr to 100 Torr, 40 Torr to 100 Torr, 45 Torr to 100 Torr, 50 Torr to 100 Torr, 55 Torr to 100 Torr, 60 Torr to 100 Torr, 65 Torr to 100 Torr, 70 Torr to 100 Torr, 75 Torr to 100 Torr, 80 Torr to 100 Torr, 85 Torr to 100 Torr, 90 Torr to 100 Torr, 95 Torr to 100 Torr, 1 Torr to 95 Torr, 1 Torr to 90 Torr, 1 Torr to 85 Torr, 1 Torr to 80 Torr, 1 Torr to 75 Torr, or 1 Torr to 70 Torr. In other further embodiments, the deposition pressure may be a pressure of 1 mTorr to 100 mTorr, 1 mTorr to 90 mTorr, 1 mTorr to 80 mTorr, 1 mTorr to 70 mTorr, 1 mTorr to 60 mTorr, 1 mTorr to 50 mTorr, 1 mTorr to 40 mTorr, 1 mTorr to 30 mTorr, 1 mTorr to 20 mTorr, 1 mTorr to 10 mTorr, 100 mTorr to 300 mTorr, 150 mTorr to 300 mTorr, 200 mTorr to 300 mTorr, or 150 mTorr to 250 mTorr, or 150 mTorr to 225 mTorr.

The substrate may comprise, consist of, or consist essentially of at least one of Si, Co, Cu, Al, W, WN, WC, TiN, Mo, MoC, $SiO_2$, W, SiN, WCN, $Al_2O_3$, AlN, $ZrO_2$, $La_2O_3$, TaN, $RuO_2$, $IrO_2$, $Nb_2O_3$, $Y_2O_3$, hafnium oxide, or any combination thereof.

The tin-containing film may comprise a tin oxide or a tin oxide film. In some embodiments, the tin-containing film comprises a functionalized tin oxide. In some embodiments, the tin-containing film comprises a functionalized tin oxide of the formula: $RSnO_z$, where z is 1 to 6. In some embodiments, R is at least one of an alkyl, an alkenyl, an alkynyl, a cycloalkyl, an aryl, a silyl, a silylalkyl, an aminoalkyl, an alkoxyalkyl, an aralkyl, or any combination thereof.

Some embodiments relate to a tin-containing film on a surface of a substrate. In some embodiments, the tin-containing film comprises any film formed according to the methods disclosed herein. In some embodiments, the tin-containing film comprises any film prepared from the precursors disclosed herein.

Example 1

Synthesis of $Me_3SiCH_2Sn(NMe_2)_3$

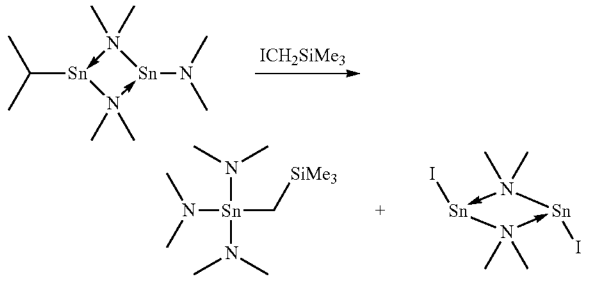

$[Sn(N(CH_3)_2)_2]_2$ (20.0 g, 48.1 mmol) was loaded into a 500 mL Schlenk flask equipped with a magnetic stir bar and diluted with 250 mL of hexanes. $ICH_2Si(CH_3)_3$ (10.8 g, 50.5 mmol) was diluted with 5 mL of hexanes and added directly to the $[Sn(N(CH_3)_2)_2]_2$ solution with stirring. Upon complete addition the reaction was stirred at 60° C., whereby, after 30 minutes the reaction presented as a light-yellow mixture. After heating for 16 hours the reaction was cooled to room temperature and presented as a pale-yellow solution with a crystalline light-yellow precipitate. The mother liquor was filtered through a disposable polyethylene filter frit into a 500 mL Schlenk flask and the resulting light-yellow solution dried under reduced pressure to yield crude $(CH_3)_3SiCH_2Sn(N(CH_3)_2)_3$ as a light-yellow liquid. The product was distilled under reduced pressure (42-49° C. @ 190-160 mTorr) and collected as a colorless liquid. Mass: 6.15 g (37.9% yield). Purity: 99.59% by $^{119}$Sn-NMR. $^1H\{^{13}C\}$-NMR (400 MHz, $C_6D_6$, 298K): −0.02 (s, 2H); 0.06 (s, 9H); 2.73 (s, 18H) ppm; $^{13}C\{^1H\}$-NMR (100 MHz, $C_6D_6$, 298K): −4.30, 1.27, 43.07 ppm; $^{29}$Si-NMR (79 MHz, $C_6D_6$, 298K): 2.57 ppm; $^{119}Sn\{^1H\}$-NMR (149 MHz, $C_6D_6$, 298K): −17.21 ppm.

Example 2

Synthesis of $(CH_3)_2N(CH_2)_3Sn(N(CH_3)_2)_3$

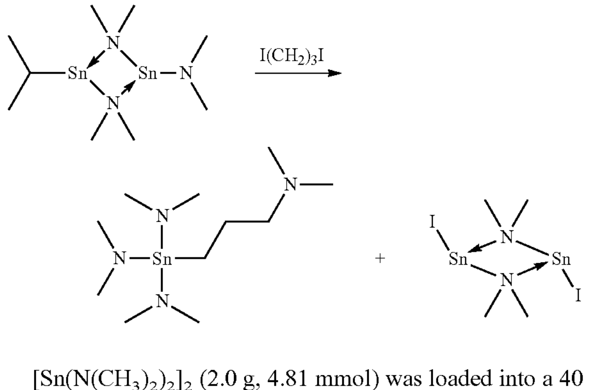

$[Sn(N(CH_3)_2)_2]_2$ (2.0 g, 4.81 mmol) was loaded into a 40 mL amber vial equipped with a magnetic stir bar and dissolved in 20 mL of hexanes. Separately, 1,3-diiodopropane was diluted with 5 mL of hexanes and added dropwise to the $[Sn(N(CH_3)_2)_2]_2$ solution with stirring over the course of two minutes. Upon complete addition the reaction was stirred at 60° C. After 12 hours the reaction presented as a yellow mixture, was filtered through a disposable polyethylene filter frit, the vial and filter cake washed with 2 mL of hexanes and the combined organics dried under reduced pressure to yield $(CH_3)_2N(CH_2)_3Sn(N(CH_3)_2)_3$ as a yellow liquid. Mass: 0.68 g, yield: 41.9%. $^1H\{^{13}C\}$-NMR (400 MHz, $C_6D_6$, 298K): 1.13 (t, 2H); 1.68 (quintet, 2H); 2.05 (s, 6H); 2.12 (t, 2H); 2.77 (s, 18H) ppm; $^{13}C\{^1H\}$-NMR (100 MHz, $C_6D_6$, 298K): 9.61, 23.75, 43.41, 45.59, 62.61 ppm; $^{119}Sn\{^1H\}$-NMR (149 MHz, $C_6D_6$, 298K): −39.89 ppm.

ASPECTS

Various Aspects are described below. It is to be understood that any one or more of the features recited in the following Aspect(s) can be combined with any one or more other Aspect(s).

Aspect 1. A composition comprising:

a precursor of the formula:

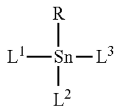

where:

R is an alkyl, an alkenyl, an alkynyl, a cycloalkyl, an aryl, a silyl, a silylalkyl, an aminoalkyl, an alkoxyalkyl, or an aralkyl;

$L^1$, $L^2$, and $L^3$ are each independently an amide, an alkoxide, an acetylide, a carbamate, or a carboxylate.

Aspect 2. The composition according to Aspect 1, wherein the precursor has a purity of at least 99%.

Aspect 3. The composition according to any one of Aspects 1-2, wherein R is $-CH_3$ or $-CH(CH_3)_2$.

Aspect 4. The composition according to any one of Aspects 1-3, wherein R is $-C_6H_5$.

Aspect 5. The composition according to any one of Aspects 1-4, wherein R is $-CH_2(C_6H_5)$.

Aspect 6. The composition according to any one of Aspects 1-5, wherein R is $-CH_2N(CH_3)_2$ or $-(CH_2)_3N(CH_3)_2$.

Aspect 7. The composition according to any one of Aspects 1-6, wherein R is $-CH_2CH_2OCH_3$.

Aspect 8. The composition according to any one of Aspects 1-7, wherein R is $-CH_2Si(CH_3)_3$.

Aspect 9. The composition according to any one of Aspects 1-8, wherein R is $-Si(CH_3)_3$.

Aspect 10. The composition according to any one of Aspects 1-9, wherein $L^1$, $L^2$ and $L^3$ are each independently at least one of the following:

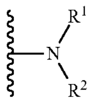
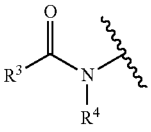
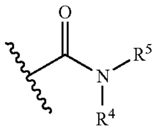
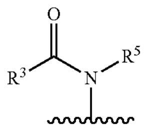
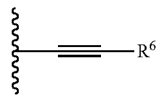

-continued

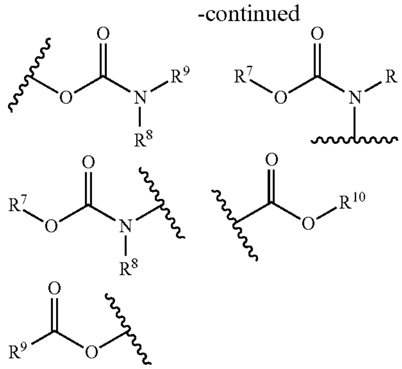

where:

$R^1$, $R^2$, $R^3$, $R^4$, $R^5$, $R^6$, $R^7$, $R^8$, $R^9$, and $R^{10}$ are each independently an alkyl, an alkenyl, an alkynyl, a cycloalkyl, an aryl, a silyl, a silylalkyl, an aminoalkyl, an alkoxyalkyl, or an aralkyl.

Aspect 11. The composition according to any one of Aspects 1-10, wherein $L^1$, $L^2$, or $L^3$ are —$N(CH_3)_2$.

Aspect 12. The composition according to any one of Aspects 1-11, wherein the precursor has the chemical structure:

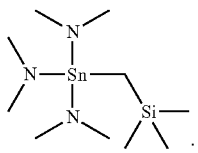

Aspect 13. The composition according to any one of Aspects 1-12, wherein the precursor has the chemical structure:

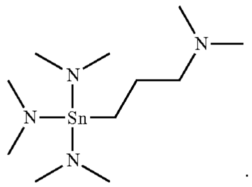

Aspect 14. A method comprising:

obtaining a tin compound, obtaining a halide compound, contacting the tin compound and the halide compound so as to form a precursor of the formula:

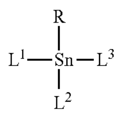

where:

R is an alkyl, an alkenyl, an alkynyl, a cycloalkyl, an aryl, a silyl, a silylalkyl, an aminoalkyl, an alkoxyalkyl, or an aralkyl;

$L^1$, $L^2$, and $L^3$ are each independently an amide, an alkoxide, an acetylide, a carbamate, or a carboxylate.

Aspect 15. The method according to Aspect 14, wherein the tin compound comprises at least one compound of the formula: $SnL_2$, wherein each L is independently $L^1$, $L^2$, or $L^3$;

wherein $L^1$, $L^2$, or $L^3$ are each independently an amide, an alkoxide, an acetylide, a carbamate, or a carboxylate.

Aspect 16. The method according to any one of Aspects 14-15, wherein $L^1$, $L^2$, and $L^3$ are each independently at least one of the following:

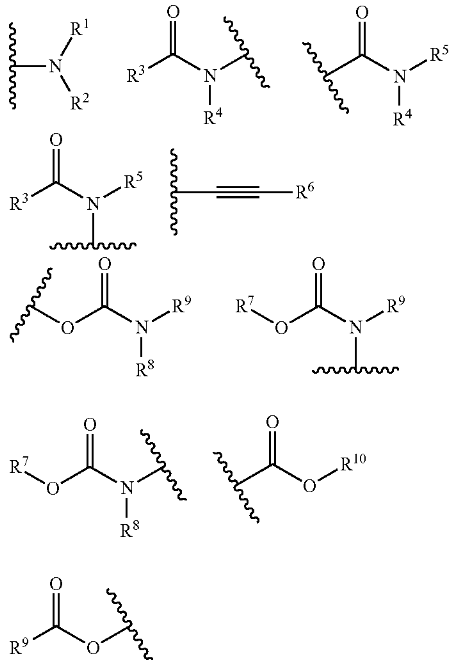

where:

$R^1$, $R^2$, $R^3$, $R^4$, $R^5$, $R^6$, $R^7$, $R^8$, $R^9$, and $R^{19}$ are each independently an alkyl, an alkenyl, an alkynyl, a cycloalkyl, an aryl, a silyl, a silylalkyl, an aminoalkyl, an alkoxyalkyl, or an aralkyl.

Aspect 17. The method according to any one of Aspects 14-16, wherein the halide compound is a compound of the formula:

X—R where:

R is an alkyl, an alkenyl, an alkynyl, a cycloalkyl, an aryl, a silyl, a silylalkyl, an aminoalkyl, an alkoxyalkyl, or an aralkyl;

X is Cl, Br, F, or I.

Aspect 18. The method according to any one of Aspects 14-17, wherein the tin compound and the halide compound are contacted in a solvent.

Aspect 19. The method according to Aspect 18, wherein the solvent comprises hexane.

Aspect 20. The method according to any one of Aspects 14-19, wherein the contacting is performed under heating at temperature in a range of 30° C. to 150° C.

Aspect 21. A method comprising:

obtaining a precursor;

wherein the precursor has the formula:

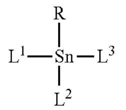

where:

R is an alkyl, an alkenyl, an alkynyl, a cycloalkyl, an aryl, a silyl, a silylalkyl, an aminoalkyl, an alkoxyalkyl, or an aralkyl;

$L^1$, $L^2$, and $L^3$ are each independently an amide, an alkoxide, an acetylide, a carbamate, or a carboxylate;

obtaining at least one co-reactant precursor;

vaporizing the precursor to obtain a vaporized precursor;

vaporizing the at least one co-reactant precursor to obtain at least one vaporized co-reactant precursor;

contacting at least one of the vaporized precursor, the at least one vaporized co-reactant precursor, or any combination thereof, with a substrate, under vapor deposition conditions, to form a tin-containing film on the substrate.

Aspect 22. The method according to Aspect 21, wherein the precursor has a purity of at least 99%.

Aspect 23. The method according to any one of Aspects 21-22, wherein R is —$CH_3$ or —$CH(CH_3)_2$.

Aspect 24. The method according to any one of Aspects 21-23, wherein R is —$C_6H_5$.

Aspect 25. The method according to any one of Aspects 21-24, wherein R is —$CH_2(C_6H_5)$.

Aspect 26. The method according to any one of Aspects 21-25, wherein R is —$CH_2N(CH_3)_2$ or —$(CH_2)_3N(CH_3)_2$.

Aspect 27. The method according to any one of Aspects 21-26, wherein R is —$CH_2CH_2OCH_3$.

Aspect 28. The method according to any one of Aspects 21-27, wherein R is —$CH_2Si(CH_3)_3$.

Aspect 29. The method according to any one of Aspects 21-28, wherein R is —$Si(CH_3)_3$.

Aspect 30. The method according to any one of Aspects 21-29, wherein $L^1$, $L^2$ and $L^3$ are each independently at least one of the following:

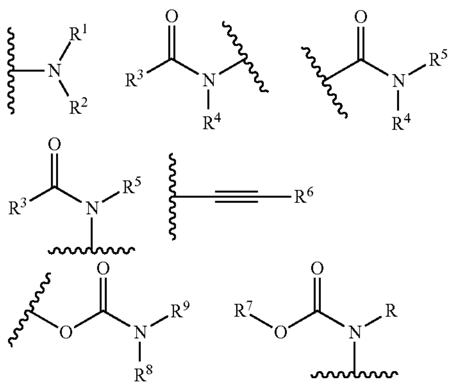

-continued

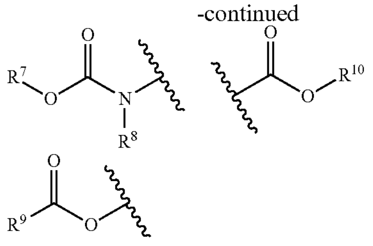

where:

$R^1$, $R^2$, $R^3$, $R^4$, $R^5$, $R^6$, $R^7$, $R^8$, $R^9$, and $R^{19}$ are each independently an alkyl, an alkenyl, an alkynyl, a cycloalkyl, an aryl, a silyl, a silylalkyl, an aminoalkyl, an alkoxyalkyl, or an aralkyl.

Aspect 31. The method according to any one of Aspects 21-30, wherein $L^1$, $L^2$, or $L^3$ are —$N(CH_3)_2$.

Aspect 32. The method according to any one of Aspects 21-31, wherein the precursor has the chemical structure:

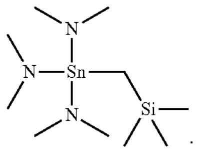

Aspect 33. The method according to any one of Aspects 21-32, wherein the precursor has the chemical structure:

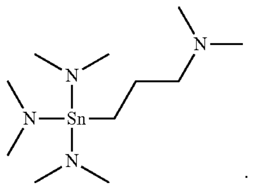

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

What is claimed is:

1. A composition comprising:

a precursor of the formula:

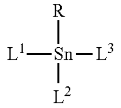

where:

R is $(CH_2)_n$—$Si(CH_3)_3$ with n=0 to 3; and $L^1$, $L^2$, and $L^3$ are each independently an amide, an acetylide, a carbamate, or a carboxylate.

2. The composition of claim 1, wherein the precursor has a purity of at least 99%.

3. The composition of claim 1, wherein R is —$Si(CH_3)_3$.
4. The composition of claim 1, wherein $L^1$, $L^2$ and $L^3$ are each independently at least one of the following:
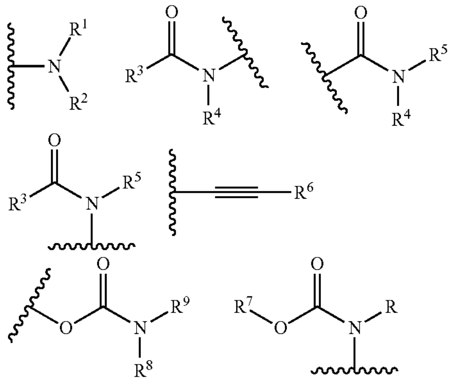
-continued
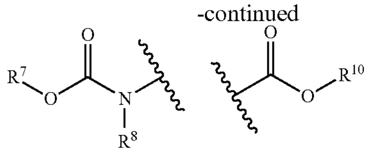
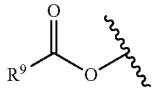
where:
$R^1$, $R^2$, $R^3$, $R^4$, $R^5$, $R^6$, $R^7$, $R^8$, $R^9$, and $R^{10}$ are each independently an alkyl, an alkenyl, an alkynyl, a cycloalkyl, an aryl, a silyl, a silylalkyl, an aminoalkyl, an alkoxyalkyl, or an aralkyl.
* * * * *